(12) United States Patent  
McCorkle et al.

(10) Patent No.: US 7,983,371 B2  
(45) Date of Patent: Jul. 19, 2011

(54) SYSTEM AND METHOD FOR USING PROGRAMMABLE FREQUENCY OFFSETS IN A DATA NETWORK

(75) Inventors: John W. McCorkle, Vienna, VA (US); Timothy R. Miller, Arlington, VA (US)

(73) Assignee: Freescale Semiconductor, Inc., Austin, TX (US)

( * ) Notice: Subject to any disclaimer, the term of this patent is extended or adjusted under 35 U.S.C. 154(b) by 1963 days.

(21) Appl. No.: 10/998,716

(22) Filed: Nov. 30, 2004

(65) Prior Publication Data

US 2006/0115032 A1 Jun. 1, 2006

(51) Int. Cl.
*H04L 7/00* (2006.01)
(52) U.S. Cl. ........ 375/355; 375/356; 375/358; 375/359; 375/371
(58) Field of Classification Search .................. 375/260, 375/354, 298, 295, 356, 364; 455/67.1; 327/291, 327/293; 326/93; 329/50, 122; 364/DIG. 1
See application file for complete search history.

(56) References Cited

U.S. PATENT DOCUMENTS

| | | | | |
|---|---|---|---|---|
| 4,652,834 | A * | 3/1987 | McAdam | 329/311 |
| 5,671,253 | A * | 9/1997 | Stewart | 375/316 |
| 5,805,871 | A | 9/1998 | Baxter | |
| 6,351,246 | B1 * | 2/2002 | McCorkle | 343/795 |
| 6,829,311 | B1 | 12/2004 | Riley | |
| 7,139,540 | B2 * | 11/2006 | Wu et al. | 455/251.1 |
| 7,212,585 | B2 * | 5/2007 | Cho et al. | 375/298 |
| 7,356,077 | B2 * | 4/2008 | Fala et al. | 375/224 |
| 2003/0048811 | A1 | 3/2003 | Robie, Jr. et al. | |
| 2006/0014515 | A1 * | 1/2006 | Ruelke et al. | 455/326 |

OTHER PUBLICATIONS

Notification of Transmittal of the International Search Report or the Declaration from Patent Cooperation Treaty issued on Oct. 17, 2006 for the corresponding International patent application No. PCT/US05/042627.
International Search Report from Patent Cooperation Treaty issued on Oct. 17, 2006 for the corresponding International patent application No. PCT/US05/042627.
Written Opinion of the International Searching Authority from Patent Cooperation Treaty issued on Oct. 17, 2006 for the corresponding International patent application No. PCT/US05/042627.

* cited by examiner

*Primary Examiner* — Chieh M Fan
*Assistant Examiner* — Qutbuddin Ghulamali (57) ABSTRACT

A method is provided for offsetting a reference frequency of a quadrature reference clock signal. A quadrature reference clock (110) generates the quadrature reference clock signal at the reference frequency, while a quadrature variable offset clock (130) generates a quadrature clock signal at a base offset frequency based on a base offset value it receives from a control circuit (560). The base offset value can be determined in many ways, including reading it from a local memory (910) or receiving it from a remote device (1010). A polyphase mixer (140) performs a polyphase mixing operation between the quadrature reference clock signal and the offset clock signal to generate an agile clock signal having an agile clock frequency equal to the reference frequency plus the base offset frequency. If desired, the method can revise the offset frequency based on actual conditions and determine a corresponding revised offset value (920, 1020).

13 Claims, 8 Drawing Sheets

SYSTEM AND METHOD FOR USING PROGRAMMABLE FREQUENCY OFFSETS IN A DATA NETWORK

CROSS-REFERENCE TO RELATED PATENT DOCUMENTS

This application is related to U.S. application Ser. No. 10/623,804, filed Jul. 22, 2003, entitled "METHOD FOR OPERATING MULTIPLE OVERLAPPING WIRELESS NETWORKS," U.S. application Ser. No. 10/259,888, filed Sep. 30, 2002, entitled "ULTRA WIDE BANDWIDTH SPREAD-SPECTRUM COMMUNICATIONS SYSTEM," and U.S. application Ser. No. 09/685,199, filed Oct. 10, 2000, entitled "A LOW POWER, HIGH RESOLUTION TIMING GENERATOR FOR ULTRA-WIDE BANDWIDTH COMMUNICATIONS SYSTEMS."

FIELD OF THE INVENTION

The present invention relates in general to wireless communication systems, such as ultra wideband (UWB) systems, including mobile transceivers, centralized transceivers, related equipment, and corresponding methods. Another aspect of the present invention relates to a wireless transceiver and related method of operation that provides a frequency offset to its operational frequency to allow for faster synchronization and resynchronization and better isolation from adjacent networks. Another aspect of the present invention relates to a wireless transceiver and related method of operation that dynamically changes the frequency offsets to account for changing circumstances.

BACKGROUND OF THE INVENTION

A wireless transceiver will generally include at least one reference clock. This clock will be set at a nominal frequency for operation of the transceiver. However, irregularities in the formation of clock crystals, changes in temperature, and other factors can introduce slight variations in frequency. When two wireless devices are communicating it may be necessary for two devices to synchronize their clocks to each other. This can be made more difficult by the fact that although the two devices might have the same nominal frequency, their actual frequencies may have slight variations. Such variations can cause their clocks to drift over time, upsetting their synchronization.

One way that this problem has been addressed is through the use of an agile clock, which can make slight variations to the frequency of the reference clock and provide this new agile clock signal in place of the reference clock signal. If one device in a pair of communicating wireless devices (generally a receiver) employs an agile clock, it can modify its effective reference clock to match that of the device it's communicating with.

However, the process of synchronizing clock frequencies takes time, and this is time that the devices are not performing their primary function. It would therefore be desirable provide a way to minimize the time required to perform the synchronization process.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

Agile Clock Circuitry

Figure 1:
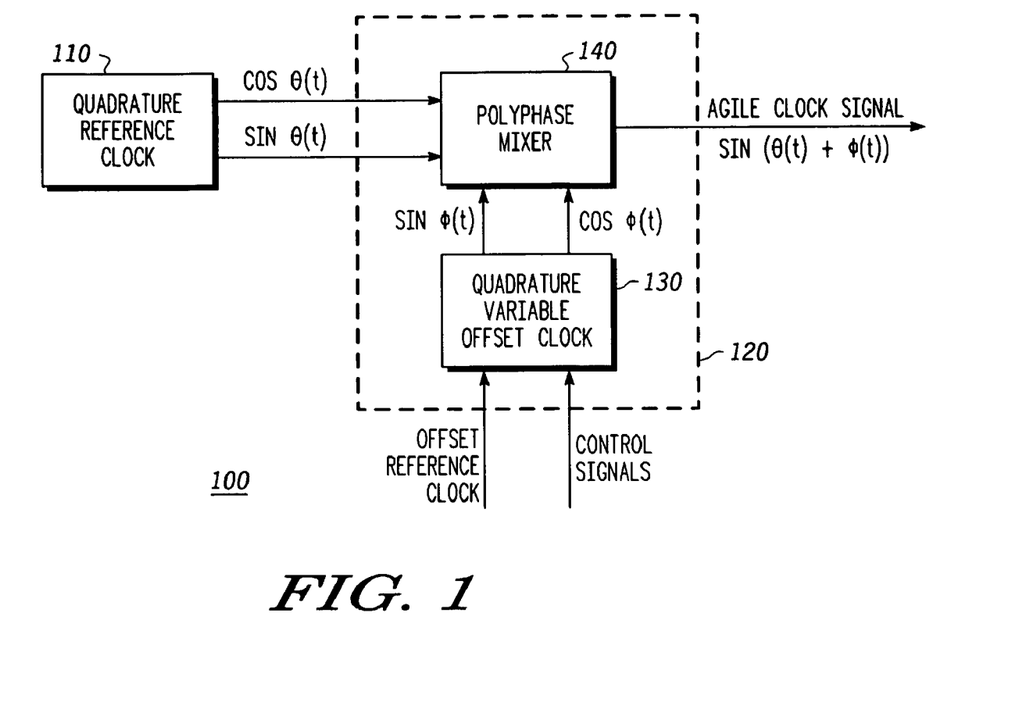
FIG. 1 is a block diagram of an clock circuit according to a disclosed embodiment of the present invention.

FIG. 1 is a block diagram of a clocking circuit according to a disclosed embodiment of the present invention. As shown in FIG. 1, the clocking circuit 100 includes a quadrature reference clock 110 and an agile clock 120. The agile clock 120 includes a quadrature variable offset clock 130 and a polyphase mixer 140.

The quadrature reference clock 110 generates a pair of quadrature reference clock signals (i.e., reference sine and cosine signals at a reference phase and frequency).

The quadrature variable offset clock 130 generates a pair of quadrature offset clock signals (i.e., offset sine and cosine signals at an offset phase and frequency). It does so based on an offset reference clock signal and a set of control signals. The quadrature variable offset clock 130 can vary the offset phase or frequency based on the control signals. However, both the offset sine and cosine values that are output at any given time are at the same phase.

The polyphase mixer 140 receives a quadrature reference clock signal from the quadrature reference clock 110, and a quadrature offset clock from the quadrature variable offset clock 130 and produces an agile clock signal that has a phase modified from the phase of the reference clock signal based on the phase of the sine and cosine generated by the quadrature variable offset clock 130. As a result of this, the phase of the offset sine and cosine generated by the quadrature variable offset clock 130 can be considered an offset phase to the quadrature reference clock phase.

In the disclosed embodiment, the quadrature reference clock signals generated by the quadrature reference clock 110 are $\sin \theta(t)$ and $\cos \theta(t)$; the quadrature offset clock signals are generated by the quadrature variable offset clock 130 are $\sin \phi(t)$ and $\cos \phi(t)$; and the agile clock signal output by the polyphase mixer 140 is $\sin(\theta(t)+\phi(t))$.

Figure 2:
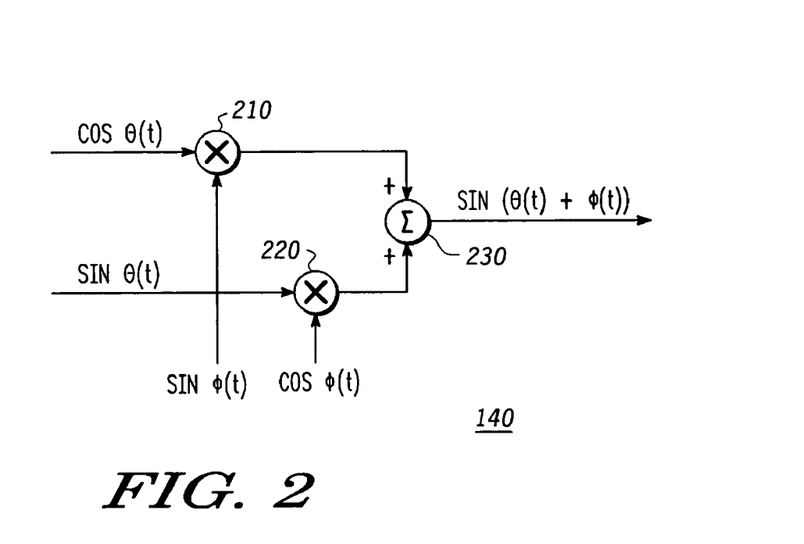
FIG. 2 is a block diagram of the polyphase mixer of FIG. 1 according to a disclosed embodiment of the present invention.

FIG. 2 is a block diagram of the polyphase mixer of FIG. 1 according to a disclosed embodiment of the present invention.

As shown in FIG. 2, the polyphase mixer 140 includes a first mixer 210, a second mixer 220, and a summer 230.

The first mixer 210 mixes the cosine portion of the quadrature reference clock signals, i.e., cos θ(t), with the sine portion of the quadrature offset clock signals, i.e., sin φ(t), to generate a first mixed signal:

$$\text{first mixed signal} = \cos\theta(t) \cdot \sin\phi(t) \quad (1)$$

Similarly, the second mixer 220 mixes the sine portion of the quadrature reference clock signals, i.e., sin θ(t), with the cosine portion of the quadrature offset clock signals, i.e., cos φ(t), to generate a second mixed signal:

$$\text{second mixed signal} = \sin\theta(t) \cdot \cos\phi(t) \quad (2)$$

The summer 230 adds the first mixed signal to the second mixed signal to provide an agile clock signal. Combining equations (1) and (2), the output of the summer 230, i.e., the agile clock output, is:

$$\text{agile clock signal} = \sin\theta(t) \cdot \cos\phi(t) + \cos\theta(t) \cdot \sin\phi(t) \quad (3)$$

Since sine and cosine can be represented as:

$$\sin\alpha = \frac{e^{j\alpha} - e^{-j\alpha}}{2}, \text{ and} \quad (4)$$

$$\cos\alpha = \frac{e^{j\alpha} + e^{-j\alpha}}{2}, \quad (5)$$

the output of the summer 230 can also be written as:

$$\frac{e^{j\theta(t)} - e^{-j\theta(t)}}{2} \cdot \frac{e^{j\phi(t)} + e^{-j\phi(t)}}{2} + \frac{e^{j\theta(t)} + e^{-j\theta(t)}}{2} \cdot \frac{e^{j\phi(t)} - e^{-j\phi(t)}}{2}, \text{ or} \quad (6)$$

$$\frac{1}{4}(e^{j(\theta(t)+\phi(t))} - e^{-j(\theta(t)+\phi(t))} + e^{-j(\theta(t)-\phi(t))} - e^{j(\theta(t)-\phi(t))}) + \quad (7)$$

$$\frac{1}{4}(e^{j(\theta(t)+\phi(t))} - e^{j(\theta(t)+\phi(t))} + e^{j(\theta(t)+\phi(t))} - e^{j(\theta(t)+\phi(t))})$$

which simplifies to:

$$\frac{e^{j(\theta(t)+\phi(t))} - e^{-j(\theta(t)+\phi(t))}}{2} = \sin(\theta(t) + \phi(t)). \quad (8)$$

Thus, when an incoming sine and cosine of a first phase θ(t) is mixed with the sine and cosine of a second phase φ(t) in the polyphase mixer 140, the result is the sine of the sum of the first and second phases (θ(t)+φ(t)). The second phase φ(t) thus becomes an offset phase for the first phase θ(t). If this offset phase varies over time by a constant value, then the varying offset phase θ(t) results in an offset frequency $F_o$ for the resulting signal, as compared to the reference clock frequency $F_r$.

Figure 3:
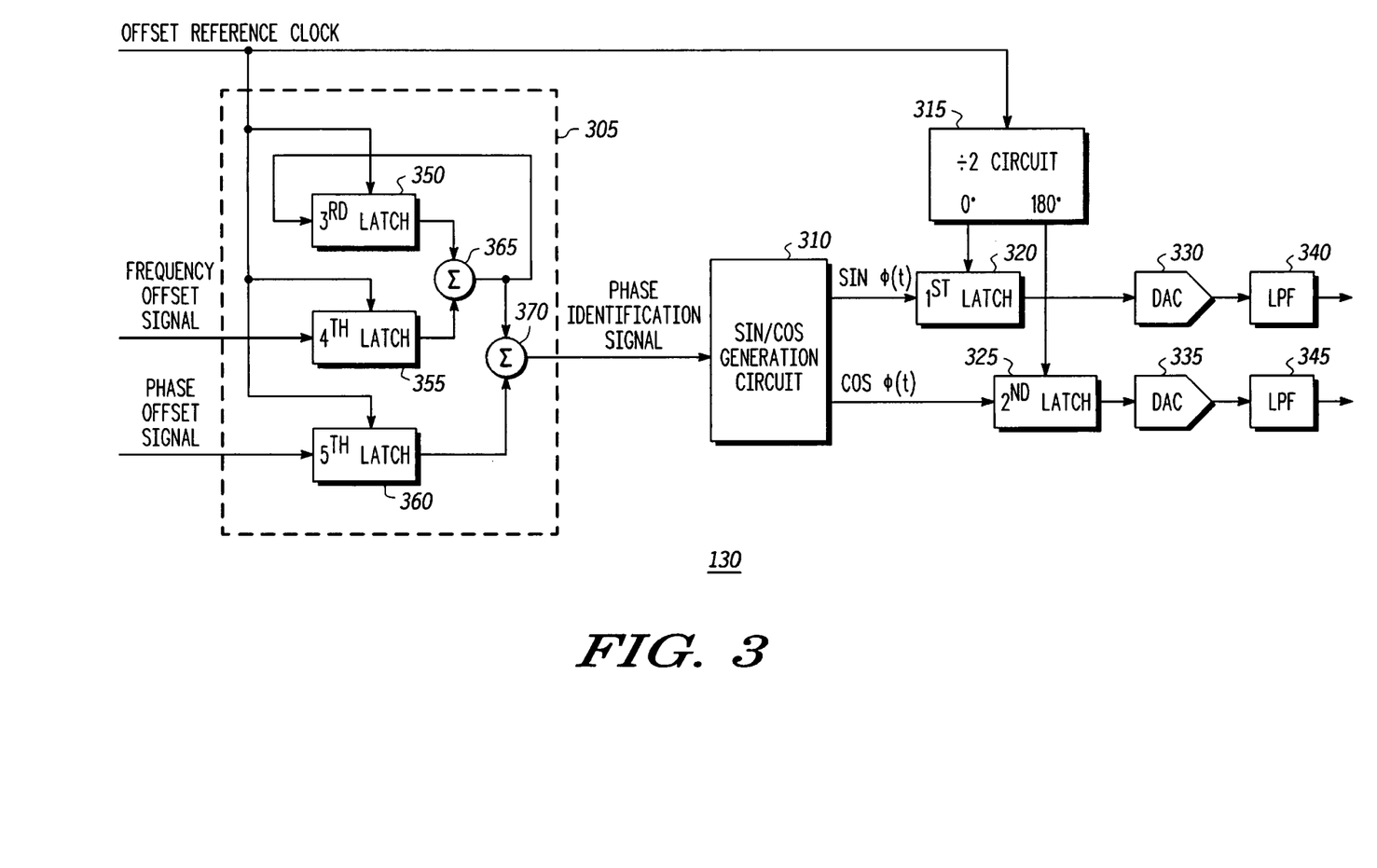
FIG. 3 is a block diagram of the quadrature variable offset clock of FIG. 1 according to a disclosed embodiment of the present invention.

FIG. 3 is a block diagram of the quadrature variable offset clock of FIG. 1 according to a disclosed embodiment of the present invention. As shown in FIG. 3, the quadrature variable offset clock 130 includes an accumulator 305, a sine/cosine generation circuit 310, a divide-by-two circuit with a two-phase output 315, first and second latches 320 and 325, first and second digital-to-analog converters (DACs) 330 and 335, and first and second low pass filters (LPFs) 340 and 345. The accumulator further comprises third through fifth latches 350, 355, and 360, and first and second summers 365 and 370.

The accumulator 305 receives the offset reference clock, a frequency offset signal, and a phase offset signal, and produces a phase identification signal that indicates the current phase of the sine and cosine values that should be output by the quadrature variable offset clock 140. The allowable values of the phase identification signal correspond to the 360 degrees of phase that define one cycle of a sine or cosine signal. Thus, if the phase identification signal can have N different values, each individual increment represents $$\frac{2\pi}{N}$$

radians (i.e., $$\frac{360}{N}$$

degrees) of phase shift.

The third and fourth latches 350 and 355 along with the first summer 365 operate as a basic accumulator. The first summer 365 adds together the value in the third latch 350 (i.e., provided by the previous output of the first summer 365) with the value in the fourth latch 355 (provided by the frequency offset signal). The first summer 365 operates in a modulo operation, so when the sum of the values stored in the third and fourth latches 350 and 355 exceeds a certain value, it wraps around to zero.

The third latch 350 updates its stored value with the output of the first summer 365 with each cycle of the offset reference clock. This allows the first summer 365 to accumulate a new frequency offset value with each new cycle of the offset reference clock.

The third latch 315 and the second adder 335 allow for adjustments to the phase identification signal. By changing the phase offset signal, the quadrature variable offset clock 130 can make corrections to the phase represented by the phase identification signal.

The second adder 370 adds the output of the first adder 365 (i.e., the current accumulated frequency offset value) with the value in the fifth latch 360 (i.e., the phase offset value) to determine the phase identification signal. If the phase offset value is zero, this will simply reflect the accumulated frequency offset value. However, if the phase offset value is non-zero, this will reflect the accumulated frequency offset value modified up or down by the value of the phase offset signal.

In an alternate embodiment the third latch 315 and the second adder 335 could be eliminated. In this case, the frequency offset signal would have to be varied whenever the phase identification signal needed to be varied by any but the frequency offset amount.

In the disclosed embodiment the frequency offset signal is constant for a given frequency offset, while the phase offset signal can vary. The constant change in phase caused by the constant frequency offset signal results in an effective change in frequency. The phase offset signal can then make immediate changes to the phase represented by the phase identification signal as needed.

In alternate embodiments, however, the frequency offset signal could be allowed to vary, causing it to act as a phase/frequency offset signal. In this case the phase offset signal could be retained as a second way to change phase, or it could be eliminated allowing the phase/frequency offset signal to take care of all phase and frequency offsets.

The frequency offset signal has a value that corresponds to a particular frequency offset. Similarly, the phase offset signal has a value that corresponds to a particular phase offset. In the disclosed embodiment, both of these signals have a 16-bit value, though in alternate embodiments it can vary in size, so long as it is of sufficient size to provide the desired frequency offset $F_o$. In addition, in the disclosed embodiment the phase/frequency offset signal is kept constant such that it corresponds to a particular frequency offset, though in alternate embodiments it could vary.

The value of $\phi(t)$ is a function of the contents of the accumulator 305; the rate of change of this phase (i.e., the frequency offset) is proportional to the value of the frequency offset signal (assuming that the phase offset signal is zero).

The sine/cosine generation circuit 310 provides a sine and cosine value corresponding to the phase identification signal output by the accumulator 305. The range of available output values are set to correspond to the values of sine and cosine for inputs varying between 0 and $2\pi$ radians (i.e., 0 to 360 degrees), addressable through the range of values of the phase identification signal.

In the disclosed embodiment the phase identification signal has an eight bit value (i.e., ranging in value from 0 to 255, representing values from 0 to $2\pi$ radians in increments of $$\frac{2\pi}{256}$$

radians). The sine/cosine generation circuit 310 generates appropriate sine and cosine values for these input values of the phase identification signal.

The sine/cosine generation circuit 310 has a sine output (sin $\phi(t)$) that provides an appropriate digital sine value corresponding to the phase identification signal, and a cosine output (cos $\phi(t)$) that provides an appropriate digital cosine value corresponding to the phase identification signal.

In one embodiment the sine/cosine generation circuit 310 is a sine/cosine lookup table, though other implementations are possible. In addition, the sine/cosine generation circuit 310 could have a single output that selectively output the sine or cosine value based on a half speed reference clock.

The first latch 320 stores the value of the sine output of the sine/cosine generation circuit 310 while the second latch 325 stores the value of the cosine output of the sine/cosine generation circuit 310.

The divide-by-two circuit 315 takes the offset reference clock and outputs a first latching clock and a second latching clock, each at half the frequency offset reference clock. The first latching clock is at a first phase while the second latching clock is 180 degrees out of phase with the first latching clock. In this way, the first latch 320 and the second latch 325 are clocked at the same frequency, but 180 degrees out of phase with each other. As a result, at any given time only one will ever be altered.

The first DAC 330 is connected to the first latch 320 and converts this digital sine value to an analog sine signal, while the second DAC 335 is connected to the second latch 320 and converts this digital cosine value to an analog cosine signal.

The first and second LPFs 340 and 345 operate to remove high frequency components of the analog sine and cosine signals output from the first and second DACs 330 and 335.

In this way the first and second LPFs 340 and 345 provide analog sine and cosine signals that are each updated according to alternate cycles of latching clocks operating at half the speed of the offset reference clock. Since the phase of these sine and cosine signals is repeatedly changed (based on the frequency offset signal), the circuit effectively operates to change the frequency of the offset reference clock.

In the disclosed embodiment the third latch 350 is 24 bits long, the fourth and fifth registers 355 and 360 are 16 bits long; the first and second summers 365 and 370 operate in modulo 24, and the phase identification signal is the topmost 8 bits from the output of the second summer 370.

As shown in FIGS. 1 to 3, in the agile clock 120 the polyphase mixer 140 operates to shift the base phase $\theta(t)$ of the reference clock signal based on the offset phase $\phi(t)$ provided by the quadrature variable offset clock 130. Thus, sine and cosine provided by the quadrature variable offset clock 130 at the reference phase $\phi(t)$ modifies the reference clock signal to create the agile clock signal with an offset phase $(\theta(t)+\phi(t))$.

As noted above, if the offset phase $\phi(t)$ is constantly shifted over time, this will correspond to a change in the frequency of the agile clock signal as compared to the reference clock signal.

Furthermore, if the sine/cosine generation circuit 310 does not take the entire value output from the second summer 370, but only a plurality of the upper bits, this will allow for more control in changing the offset phase $\phi(t)$, and thus greater granularity in changing the offset frequency $F_o$. For example, in the disclosed embodiment, 24 bits are provided at the output of the second summer 370, but the sine/cosine generation circuit 310 only takes the top 8 bits as an input. This means that the sine and cosine values output from the sine/cosine generation circuit 310 will only change when the accumulated value output from the second summer 370 gets large enough to change one of the top eight bits. Depending upon the value of the frequency offset signal (assuming a phase offset signal with zero value), the offset frequency $\phi(t)$ can change rapidly or could have a much slower rate of change. A rapid change results in a larger frequency offset $F_o$ and a slower change causes a lower frequency offset $F_o$.

Wireless Network

Figure 4:
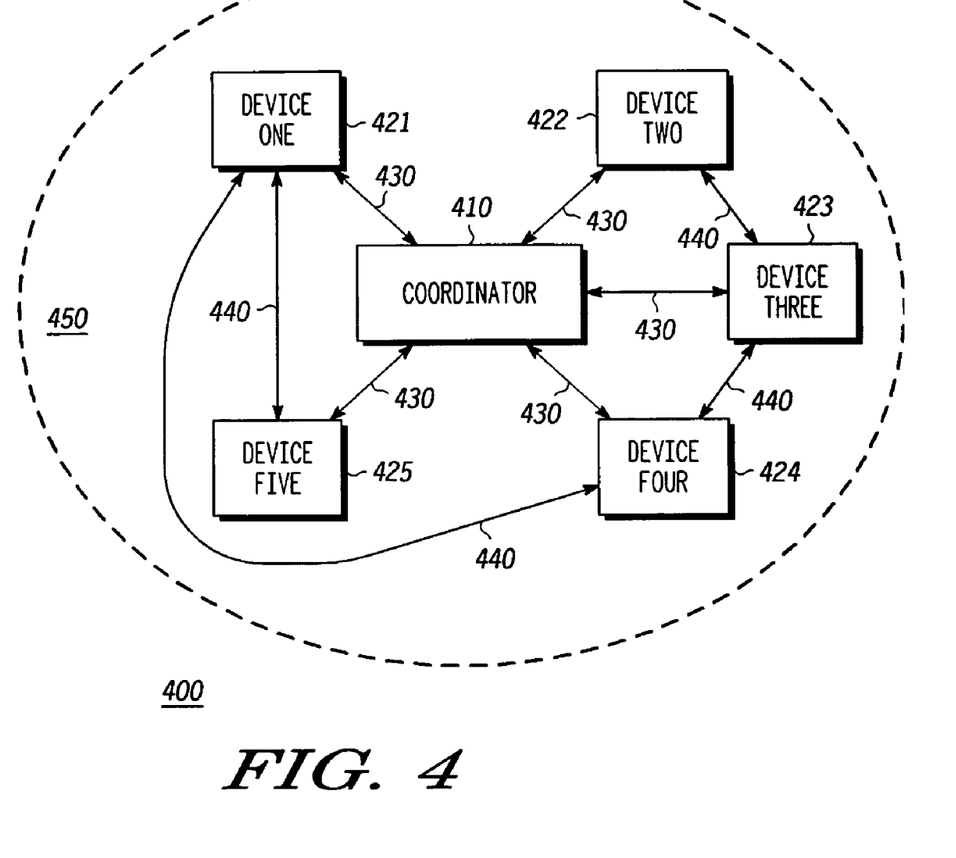
FIG. 4 is a block diagram of a wireless network according to a disclosed embodiment of the present invention.

FIG. 4 is a block diagram of a wireless network 400 according to a disclosed embodiment of the present invention. In this embodiment the network 400 is a wireless personal area network (WPAN), or piconet. However, it should be understood that the present invention also applies to other settings where bandwidth is to be shared among several users, such as, for example, wireless local area networks (WLAN), or any other appropriate wireless network.

When the term piconet is used, it refers to a network of devices connected in an ad hoc fashion, having one device act as a coordinator (i.e., it functions as a server) while the other devices (sometimes called stations) follow the time allocation instructions of the coordinator (i.e., they function as clients). The coordinator can be a designated device, or simply one of the devices chosen to function as a coordinator. One primary difference between the coordinator and non-coordinator devices is that the coordinator must be able to communicate with all of the devices in the network, while the various non-coordinator devices need not be able to communicate with all of the other non-coordinator devices.

As shown in FIG. 4, the network 400 includes a coordinator 410 and a plurality of devices 421-425. The coordinator 410 serves to control the operation of the network 400. As noted above, the system of coordinator 410 and devices 421-425 may be called a piconet, in which case the coordinator 410 may be referred to as a piconet coordinator (PNC). Each of the non-coordinator devices 421-425 must be connected to the coordinator 410 via primary wireless links 430, and may also be connected to one or more other non-coordinator devices 421-425 via secondary wireless links 440, also called peer-to-peer links.

In addition, although FIG. 4 shows bi-directional links between devices, they could also be shown as unidirectional links. In this case, each bi-directional link 430, 440 could be shown as two unidirectional links, the first going in one direction and the second going in the opposite direction.

In some embodiments the coordinator 410 may be the same sort of device as any of the non-coordinator devices 421-425, except with the additional functionality for coordinating the system, and the requirement that it communicate with every device 421-425 in the network 400. In other embodiments the coordinator 410 may be a separate designated control unit that does not function as one of the devices 421-425.

In some embodiments the coordinator 410 will be a device just like the non-coordinator devices 421-425. In other embodiments the coordinator 410 could be a separate device dedicated to that function. Furthermore, individual non-coordinator devices 421-425 could include the functional elements of a coordinator 410, but not use them, functioning as non-coordinator devices. This could be the case where any device is a potential coordinator 410, but only one actually serves that function in a given network.

Each device of the network 400 may be a different wireless device, for example, a digital still camera, a digital video camera, a personal data assistant (PDA), a digital music player, or other personal wireless device.

The various non-coordinator devices 421-425 are confined to a usable physical area 450, which is set based on the extent to which the coordinator 410 can successfully communicate with each of the non-coordinator devices 421-425. Any non-coordinator device 421-425 that is able to communicate with the coordinator 410 (and vice versa) is within the usable area 450 of the network 400. As noted, however, it is not necessary for every non-coordinator device 421-425 in the network 400 to communicate with every other non-coordinator device 421-425.

Receiver Circuitry

Figure 5:
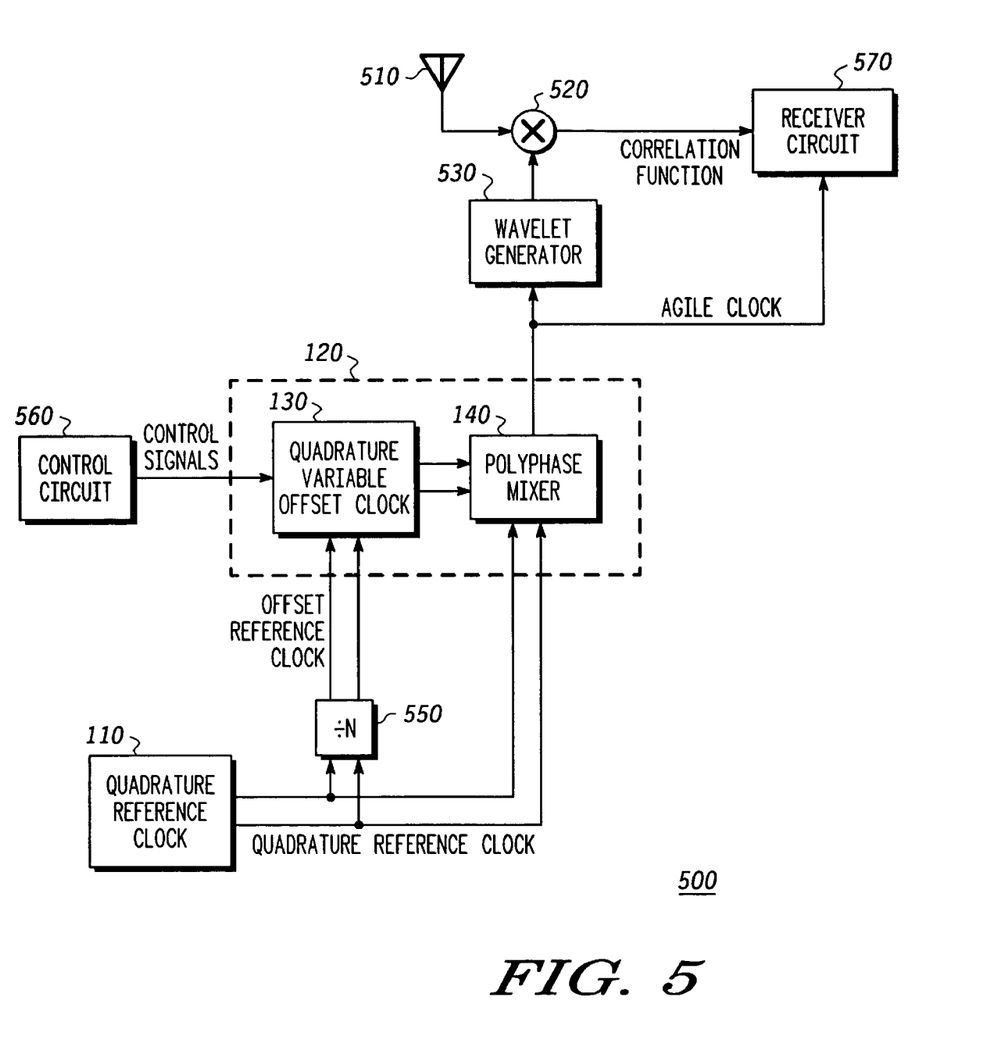
FIG. 5 is a block diagram of a wireless receiver according to a first disclosed embodiment of the present invention.

FIG. 5 is a block diagram of a wireless receiver according to a first disclosed embodiment of the present invention. As shown in FIG. 5, the wireless receiver 500 includes an antenna 510, a simple mixer 520, a wavelet generator 530, an agile clock 120, a quadrature reference clock 110, a divide-by-N circuit 550, a control circuit 560, and a receiver circuit 570. The agile clock 120 further includes a quadrature variable offset clock and a polyphase mixer 140. In the embodiment shown in FIG. 5, the wireless receiver is an ultra wideband (UWB) receiver, though alternate embodiments could be other types of wireless receiver.

The antenna 510 receives energy from a wireless signal and provides that energy as a received signal to the simple mixer 520 for processing. Although not shown, the wireless receiver 500 could include additional circuitry between the antenna 510 and the mixer. For example there could be front end amplifiers, filters, or other signal processing circuitry.

In the embodiment shown in FIG. 5, a UWB antenna may be used, such as the one disclosed in U.S. Pat. No. 6,590,545 to McCorkle, entitled "ELECTRICALLY SMALL PLANAR UWB ANTENNA APPARATUS AND SYSTEM THEREOF." However, alternate embodiments can use different antenna designs.

The simple mixer 520 receives a wavelet from the wavelet generator 530 and the incoming signal from the antenna 510 and mixes the two to provide a correlation function. This correlation function is sent to the receiver circuit 570 for further processing.

The wavelet generator 530 provides wavelets of two or more shapes to the simple mixer 520 based on a received agile clock signal. For a binary-encoded system the wavelet generator 530 provides two wavelet shapes, and for a ternary-encoded system the wavelet generator 530 provides three wavelet shapes. In a disclosed binary-encoded embodiment the two wavelets are inverses of each other. In a disclosed ternary-encoded embodiment two of the wavelets are inverses of each other and the third is a null wavelet having zero voltage.

In one disclosed embodiment some wavelets are formed by repeated cycles of a sinusoidal signal. In this case, the wavelets can be formed directly from the agile clock signal. In alternate embodiments different types of wavelets could be used, e.g., Gaussian monopulses. In such a case, the timing of the wavelets would be determined by the agile clock signal.

The quadrature reference clock 110 provides a quadrature reference clock signal at a set frequency. In one embodiment, the reference clock 540 is a crystal clock whose frequency is determined by the crystal frequency.

The divide-by-N circuit 550 receives the quadrature reference clock signal and provides an offset reference clock signal at $$\frac{1^{th}}{N}$$

the frequency of the quadrature reference clock signal.

The agile clock 120 receives a quadrature reference clock signal and the offset reference clock signal and provides an agile clock signal. In the disclosed embodiment it operates as described above with reference to FIGS. 1 to 3. In particular, the agile clock signal can have its phase or frequency offset from that of the reference clock signal by a phase or frequency offset.

The control circuit 560 operates along with the receiver circuit 570 to provide phase and frequency offset signals to the quadrature variable offset clock 130.

The receiver circuit 570 receives the correlation function and the agile clock signal and processes the correlation function to extract the data from the incoming wireless signal.

Figure 6:
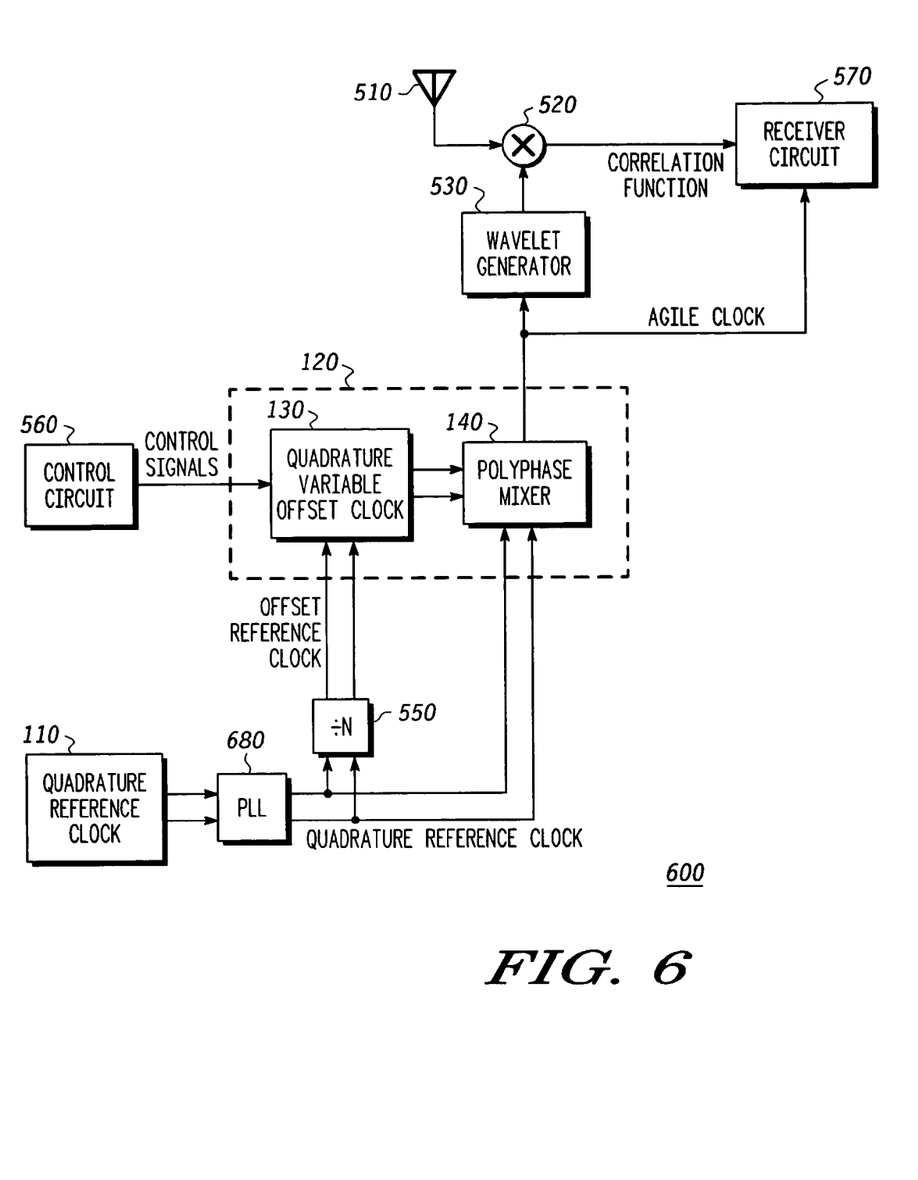
FIG. 6 is a block diagram of a wireless receiver according to a second disclosed embodiment of the present invention.

FIG. 6 is a block diagram of a wireless receiver according to a second disclosed embodiment of the present invention. As shown in FIG. 6, the wireless receiver 600 includes an antenna 510, a simple mixer 520, a wavelet generator 530, an agile clock 120, a quadrature reference clock 110, a control circuit 560, a receiver circuit 570, and a phase locked loop (PLL) 680. The agile clock further includes including a quadrature variable offset clock 130 and a polyphase mixer 140. In the embodiment shown in FIG. 6, the wireless receiver 600 is an ultra wideband (UWB) receiver, though alternate embodiments could be other types of wireless receiver.

In the wireless receiver 600 of FIG. 6, like numbered elements operate in a manner similar to that described above with respect to FIG. 5.

In addition, in this circuit 600, the quadrature reference clock 110 provides an intermediate quadrature clock signal at a set frequency. In one embodiment, the reference clock 110 is a crystal clock whose frequency is determined by the crystal frequency.

The PLL 680 operates to step up or step down the frequency of the intermediate quadrature clock to generate a quadrature reference clock. For example, in one disclosed embodiment the PLL 680 is a x3 PLL, which multiplies the frequency of the intermediate quadrature signal by three to get a quadrature reference clock signal that has a quadrature reference clock frequency that is three times an intermediate clock frequency. This multiplication factor can be altered in various embodiments, and may be fractional.

The agile clock 120 receives the quadrature reference clock signal and provides an agile clock signal. In the disclosed embodiment it operates as described above with reference to FIGS. 1 to 3.

Figure 7:
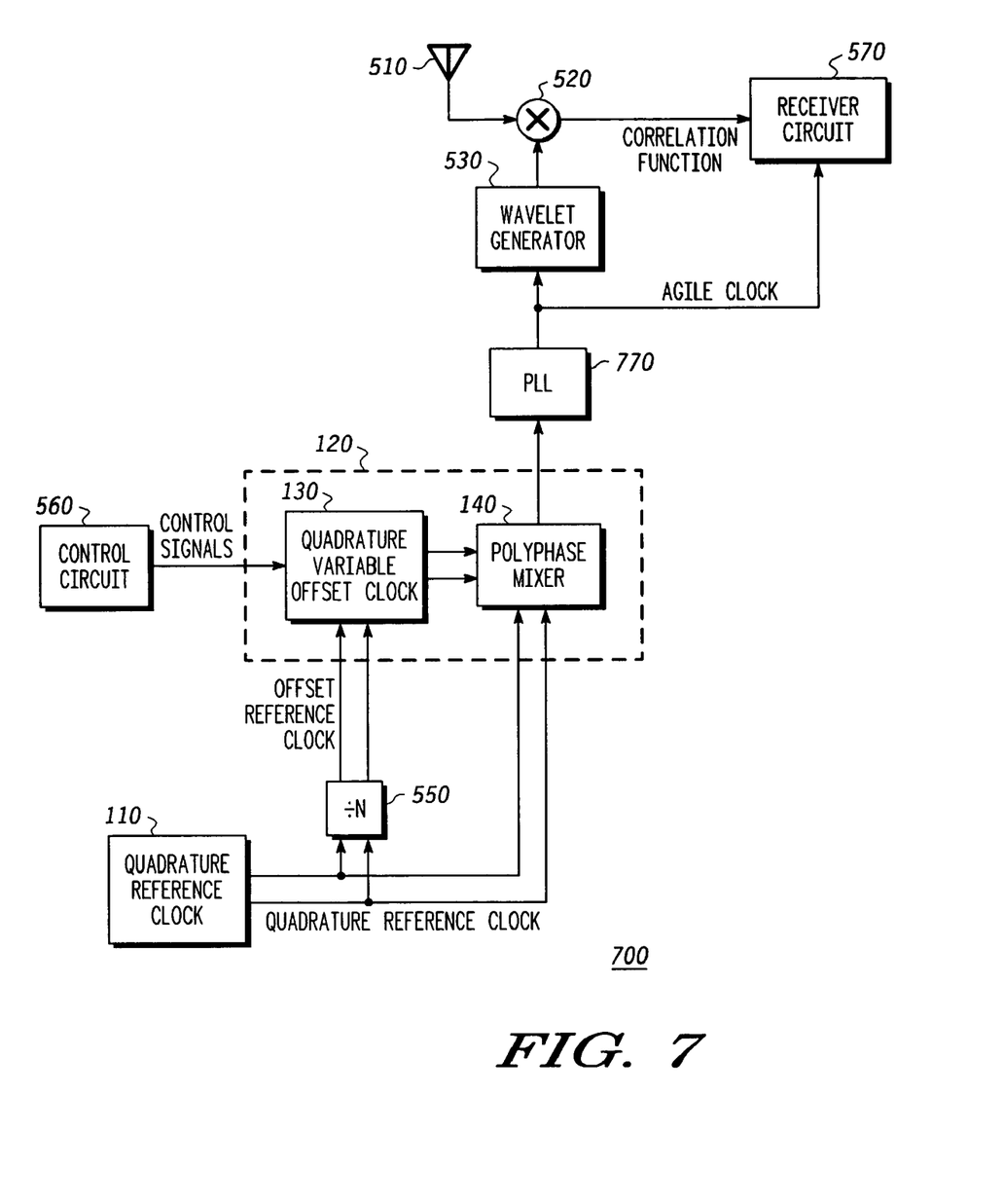
FIG. 7 is a block diagram of a wireless receiver according to a second disclosed embodiment of the present invention.

FIG. 7 is a block diagram of a wireless receiver according to a second disclosed embodiment of the present invention. As shown in FIG. 7, the wireless receiver 500 includes an antenna 510, a simple mixer 520, a wavelet generator 530, an agile clock 120, a reference clock 110, a control circuit 560, a receiver circuit 570, and a phase locked loop (PLL) 780. The agile clock further includes including a quadrature variable offset clock 130 and a polyphase mixer 140. In the embodiment shown in FIG. 7, the wireless receiver 700 is an ultra wideband (UWB) receiver, though alternate embodiments could be other types of wireless receiver.

In the wireless receiver 700 of FIG. 7, like numbered elements operate in a manner similar to that described above with respect to FIG. 5.

In addition, in this circuit 700, the agile clock 120 operates as described above with reference to FIGS. 1 to 3 to provide an intermediate clock signal to the PLL 780.

The PLL 780 operates to step up or step down the frequency of the intermediate clock signal to generate an agile clock. For example, in one disclosed embodiment the PLL 780 is a x3 PLL, which multiplies the frequency of the intermediate clock signal by three to get an agile clock signal that has an agile clock frequency that is three times an intermediate clock frequency. This multiplication factor can be altered in various embodiments, and may be fractional.

Transmitter Circuitry

Figure 8:
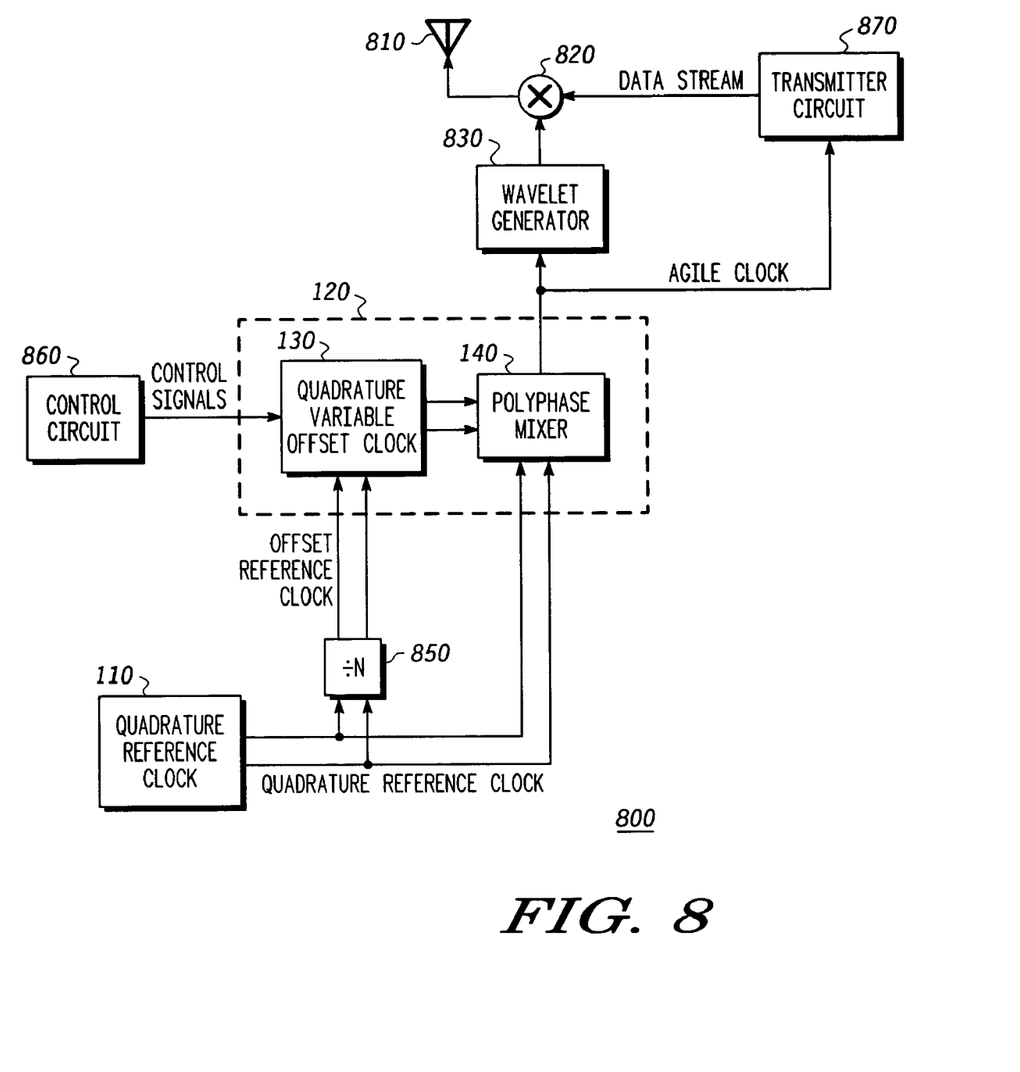
FIG. 8 is a block diagram of a wireless transmitter according to a first disclosed embodiment of the present invention.

FIG. 8 is a block diagram of a wireless transmitter according to a first disclosed embodiment of the present invention. As shown in FIG. 8, the wireless transmitter 800 includes an antenna 810, a simple mixer 820, a wavelet generator 830, an agile clock 120, a quadrature reference clock 110, a control circuit 860, and a transmitter circuit 870. The agile clock further includes including a quadrature variable offset clock 130 and a polyphase mixer 140. In the embodiment shown in FIG. 8, the wireless transmitter 800 is an ultra wideband (UWB) transmitter, though alternate embodiments could be other types of wireless transmitter.

The antenna 810 transmits energy that it receives from the simple mixer 820 as a wireless signal. Although not shown, the wireless transmitter 800 could include additional circuitry between the antenna 810 and the simple mixer 820. For example the circuit could include amplifiers, filters, or other signal processing circuitry.

In the embodiment shown in FIG. 8, a UWB antenna may be used, such as the one disclosed in U.S. Pat. No. 6,590,545 to McCorkle, entitled "ELECTRICALLY SMALL PLANAR UWB ANTENNA APPARATUS AND SYSTEM THEREOF." However, alternate embodiments can use different antenna designs.

The simple mixer 820 receives a wavelet from the wavelet generator 830 and a data stream from the transmitter circuit 850 and mixes the two to provide an encoded signal that can be transmitted by the antenna 810.

The wavelet generator 830 provides wavelets of two or more shapes to the simple mixer 820 based on a received agile clock signal. For a binary-encoded system the wavelet generator 830 provides two wavelet shapes; and for a ternary-encoded system the wavelet generator 830 provides three wavelet shapes. In a disclosed binary-encoded embodiment the two wavelets are inverses of each other. In a disclosed ternary-encoded embodiment two of the wavelets are inverses of each other and the third is a null wavelet having zero voltage.

In one disclosed embodiment some wavelets are formed by repeated cycles of a sinusoidal signal. In this case, the wavelets can be formed directly from the agile clock signal. In alternate embodiments different types of wavelets could be used, e.g., Gaussian monopulses. In such a case, the timing of the wavelets would be determined by the agile clock signal.

The agile clock 120 receives a quadrature reference clock signal and an offset reference clock signal and provides an agile clock signal. In the disclosed embodiment it operates as described above with reference to FIGS. 1 to 3.

The quadrature reference clock 110 provides a quadrature reference clock signal at a set frequency. In one embodiment, the quadrature reference clock 110 is a crystal clock whose frequency is determined by the crystal frequency.

The transmitter circuit 870 receives the agile clock signal and generates a data stream for transmission.

The control circuit 860 operates along with the transmitter circuit 870 to provide phase and frequency offset signals to the quadrature variable offset clock 130.

Although not shown, the transmitter circuit 700 could include a phase locked loop (PLL) either before or after the agile clock 120 to alter the frequency of either the signal provided by the agile clock 120 or the reference clock 850. This operation of the transmitter circuit 700 will be altered in a way that is analogous to the operation of the circuits of FIGS. 5 and 6.

Channel Separation

In addition to allowing for frequency corrections to account for the inherent variations in device reference clock frequencies, the ability of the agile clock 120 to vary its agile clock frequency also allows for overlapping networks or individual device pairs to achieve better channel separation by having slightly different frequencies. In this case, the nominal reference frequency for a given network or device pair is offset by a unique offset value. Thus, each network or device pair will have nearly the same carrier frequency for its wavelets, but none will be identical.

Tables 1A and 1B show examples of frequency offset values as they are used in various embodiments of the present invention. For ease of description, these tables describe channel separation for individual networks. It should be understood, however, that these frequency offsets could also be used for device pair communications if desired.

Table 1A shows an embodiment having seven overlapping networks, and is exemplary of embodiments requiring an odd number of frequency offsets. Table 1B shows an embodiments having four overlapping networks, and is exemplary of embodiments requiring an even number of frequency offsets. This frequency offset can work for any sort of wavelet, whether a monopulse, a section of an oscillating signal, etc.

TABLE 1A

Frequency Offset Values for up to Seven Overlapping Networks

| Network Identifier | Frequency Offset Value |
|---|---|
| 0 | −39 MHz |
| 1 | −26 MHz |
| 2 | −13 MHz |
| 3 | Unchanged |
| 4 | +13 MHz |
| 5 | +26 MHz |
| 6 | +39 MHz |

As shown in Table 1A, the nominal reference frequency of each network is adjusted by the appropriate frequency offset value. In this embodiment one network uses the nominal reference frequency, while the remaining networks use an offset reference frequency. It can be advantageous if the offset frequencies are symmetrical around the nominal reference frequency. Each of the possible frequency offset values are offset from adjacent frequency offset values by a set interval corresponding to an offset frequency step, e.g., 13 MHz in this embodiment.

TABLE 1B

Frequency Offset Values for up to Four Overlapping Networks

| Network Identifier | Frequency Offset Value |
|---|---|
| 0 | −39 MHz |
| 1 | −13 MHz |
| 2 | +13 MHz |
| 3 | +39 MHz |

As shown in Table 1B, the reference frequency of each network is adjusted from the nominal reference frequency by the appropriate frequency offset value. In this embodiment, none of the networks use the nominal carrier frequency. Instead each network uses an offset carrier frequency. It can be advantageous if the offset frequencies are symmetrical around the nominal reference frequency. Each of the possible frequency offset values are offset from adjacent frequency offset values by a set interval corresponding to an offset frequency step, e.g., 26 MHz in this embodiment.

Although Tables 1A and 1B show offset values for four and seven networks, more or fewer overlapping networks could be accommodated. Also, while in the disclosed embodiment the offset values are multiples of 13 MHz (i.e., it uses a offset frequency step of 13 MHz), in alternate embodiments the offset frequency step could be changed. Some possible offset frequency steps are multiples of 2 MHz and multiples of 3 MHz. In some embodiments the offset frequencies could use a different offset frequency step, or even have no set offset frequency step at all, varying from each other according to no set pattern. The practical limit of the offset values can be used is the tuning range of the oscillator used.

The use of the frequency offset value provides a degree of channel drift that keeps the channels used by each network from becoming stationary with respect to the other channels. This is helpful because if two (or more) overlapping networks each have a slightly offset frequencies, the phases of the networks will drift with time. This means that any significant interference between any two networks will fade away with time as the phases of each network drift with respect to each other. And while the differing offset reference frequencies also means that any interferences will also come back, their transitory nature means that they can often be corrected for through signal processing, e.g., through the use of forward error correction (FEC).

In embodiments that employ frequency offsets for channel separation, it is also possible to include an additional frequency offset to account for the slight variations in reference frequency for each device from the nominal reference frequency. In this case, the offset value stored in the phase/frequency offset register 310 should account for the sum of all desired frequency offsets that the quadrature variable offset clock 130 will control.

Operation

In operation, the agile clock 120 of FIGS. 1 to 3 and 5 to 8 produces an agile clock signal that has a phase equal to the base phase $\theta(t)$ of the reference clock signal plus an offset phase $\phi(t)$. And as noted above, if this offset phase $\phi(t)$ changes over time, it also results in a frequency offset $F_o$, such that the frequency of the agile clock is equal to the reference frequency $F_r$ of the reference clock signal plus the frequency offset $F_o$.

As noted with respect to FIGS. 5 to 8, the frequency offset value is derived from the frequency offset signal, which is set by control circuitry 560, 860. However, there are a variety of ways in which the control circuitry 560, 860 can determine what frequency offset values should be used.

In one embodiment, the value of the frequency offset signal can be set directly by a user. This could happen when a user in a device 421-425 wants to manually change the channel separation offset frequency that is used for a given communication.

In another embodiment, a network coordinator 410 can instruct a device 421-425 as to what frequency offset should be used. In this case, the coordinator 410 could have a database of channel offset values associated with different networks and device pairs. It could then provide instructions when it gives a channel time allocation to a device as to what frequency offset should be used.

In still another embodiment, the control circuit 560, 860 in a device 421-425 could determine on its own what frequency offset should be used. The local device could have its own database regarding what networks and device pairs are using what channel offset, and could determine based on the device it was in communication with what channel frequency offset to use. Furthermore, the local device could also determine a corrective frequency offset needed to account for the slight differences in reference frequency for a transmitting and receiving device. If the local device determines multiple offsets for multiple reasons, it should sum these offsets to determine a comprehensive offset value and use that value to determine the value that should be sent as the frequency offset signal.

It is also possible to combine these different embodiments. For example, a coordinator 410 might provide instructions regarding the channel separation frequency offset, while the local device 421-425 could determine the corrective frequency offset needed to account for the slight differences in reference frequency for a transmitting and receiving device. In this case, the control circuit 560, 860 would take all of the frequency offset information it receives, determine what the corresponding offset value would be to achieve the aggregated frequency offset, and provide the phase/frequency offset register 310 with the proper offset value.

Figure 9:
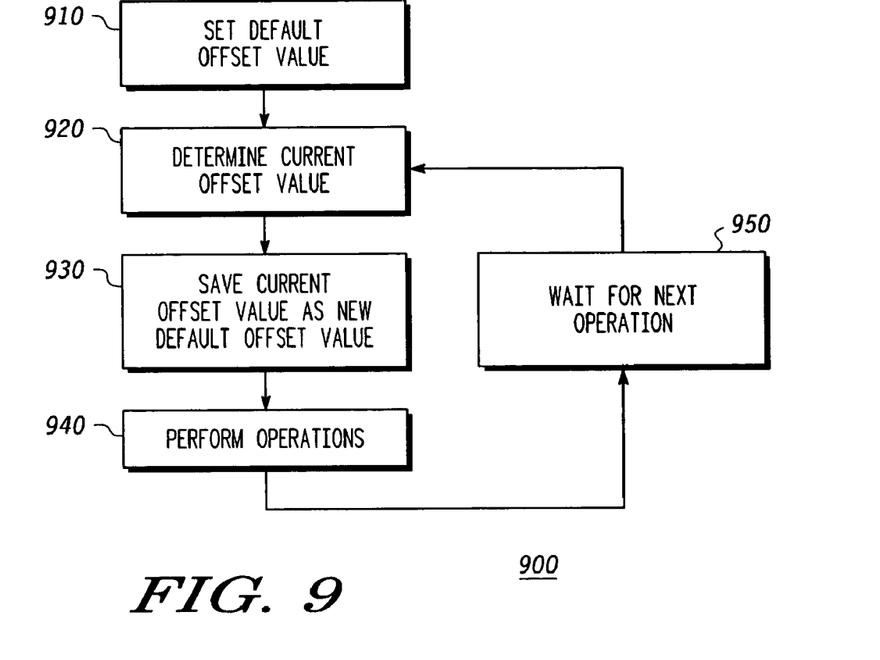
FIG. 9 is a flow chart of a method of programming frequency offsets according to a disclosed embodiment of the present invention.

FIG. 9 is a flow chart of a method of programming frequency offsets according to a disclosed embodiment of the present invention. In this particular embodiment the information regarding the required frequency offset comes from the local device 421-425. As shown in FIG. 9, the frequency programming method 900 begins by having the local device 421-425 determine and set a base offset value. (Step 910) This base offset value can be determined in any desired way, e.g., reading it from a local memory contained in a control circuit in the local device 421-425.

The local device 421-425 then determines a current offset value for a given communication stream (i.e., a given communication with a remote device 421-425). (Step 920) This can include determining a proper channel frequency offset based on the base offset value and a corrective frequency offset to account for the slight differences in reference frequency for a transmitting and receiving device.

The local device 421-425 then stores the current offset value as the new base offset value. (Step 930) Thus, the next time the local device 421-425 begins a communication stream, it will use this updated value as its base offset value. In one embodiment, a single base offset value is stored. In other embodiments, the local device 421-425 can store an array of base offset values. These can be stored based on network, device, or any other desired parameter. If an array is used, then the base offset used in a given determination of the current offset (i.e., at the start of each Step 920) is read from the array based on the appropriate parameters.

After storing the new base offset value, the local device 421-425 then performs all necessary operations at the properly offset agile clock frequency (Step 940), and then waits for the next operation (Step 950), during which it uses the stored base value for determining the current offset value (Step 920).

In this way, if during the next communication stream it processes the local device 421-425 talks to the same remote device 421-425 (or if an array of base values is used, a device that has a recent entry in the array), the base value for the offset frequency should be the same as, or at least very close to, the desired frequency offset value. This can significantly reduce the time required to determine the current offset value in a later performance of Step 920. And if during the next communication stream it processes the local device 421-425 talks to a different remote device 421-425, the stored offset value should be no worse than the original base offset value.

Figure 10:
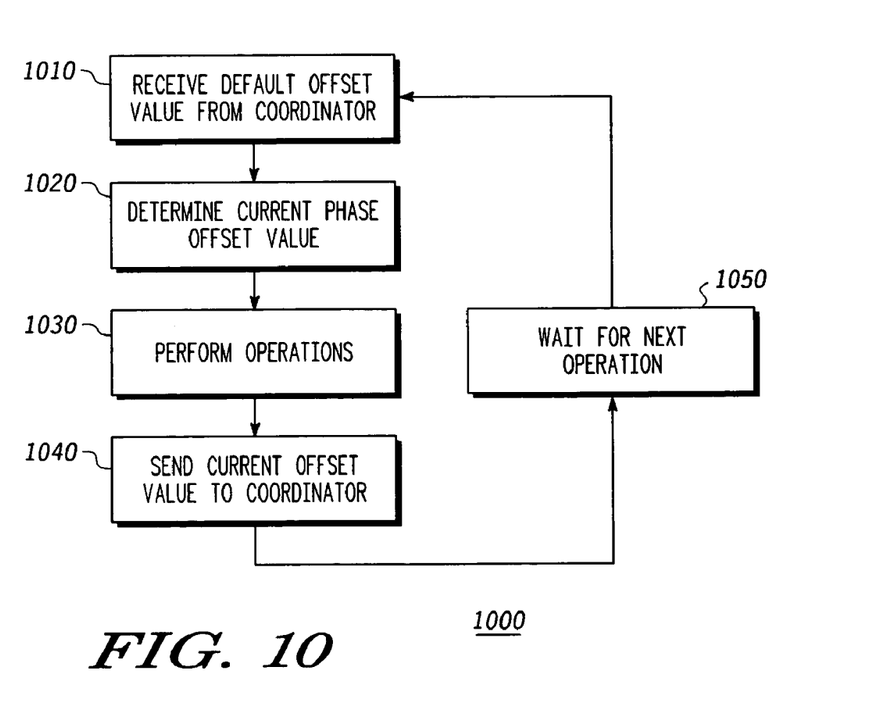
FIG. 10 is a flow chart of a method of programming frequency offsets according to another disclosed embodiment of the present invention.

FIG. 10 is a flow chart of a method of programming frequency offsets according to another disclosed embodiment of the present invention. In this particular embodiment the information regarding the required frequency offset comes from a network coordinator 410. As shown in FIG. 10, the frequency programming method 1000 begins by having the local device 421-425 receive a base offset value from the coordinator 410. (Step 1010)

The local device 421-425 then determines a current offset value for a given communication stream using the base offset value as a starting point. (Step 1020) This can include determining a proper corrective frequency offset to account for the slight differences in reference frequency for a transmitting and receiving device.

The local device 421-425 then performs all necessary operations at the properly offset agile clock frequency (Step 1030).

The local device 421-425 then sends the current offset value to the coordinator 410 (Step 1040), which can store this as the new base offset value in memory. Thus, the next time the local device 421-425 begins a communication stream with the same remote device 421-425, the coordinator 410 it will send it the updated base offset value. These can be stored in the coordinator 410 based on network, device, or any other desired parameter.

After sending the current offset value to the coordinator 410, the local device 421-425 then waits for the next operation (Step 1050), at which time it will receive a new base offset value from the coordinator 410 (Step 1010).

In this way, if during the next communication stream it processes the local device 421-425 talks to any device 421-425 that it has recently spoken to, the base offset value for the frequency offset should be the same as, or at least very close to, the desired frequency offset value. This can significantly reduce the time required to determine the current offset value in a later performance of Step 1020. And if during the next communication stream it processes the local device 421-425 talks to a different remote device 421-425, the stored base offset value should be no worse than the original base offset value.

In alternate embodiments of the method 1000 of FIG. 10, the order of Step 1040 and Step 1030 can be reversed.

In some embodiments the frequency offset $F_o$ will be set entirely based on variations to the offset value in the phase/frequency offset register 310. However, in alternate embodiments some or all of the frequency offset can be provided through the use of a phase locked loop, such as is shown in FIGS. 5 and 6. In one embodiment, the PLL 680, 780 can be controlled to vary its frequency multiplier to obtain the desired frequency offset $F_o$. In another embodiment the PLL 680, 780 can be controlled to vary its frequency multiplier to get a frequency close to the desired frequency offset $F_o$, and the agile clock 120 can provide smaller frequency variations to obtain the final desired frequency offset $F_o$.

In this way, a method of offsetting a reference frequency of a quadrature reference clock signal is provided, comprising: generating the quadrature reference clock signal at the reference frequency, the quadrature reference clock signal comprising first and second sinusoidal signals; determining a base offset value corresponding to a base offset frequency; determining a phase offset value corresponding to an offset phase; generating a quadrature clock signal at the base offset frequency based at least in part on the base offset value, the offset clock signal comprising third and fourth sinusoidal signals; and performing a polyphase mixing operation between the quadrature reference clock signal and the offset clock signal to generate an agile clock signal having an agile clock frequency equal to the reference frequency plus the base offset frequency, wherein the base offset value is chosen from a plurality of possible offset values, wherein the quadrature clock signal is generated at the base offset frequency based at least in part on the frequency offset value, and at the offset phase based at least in part on the phase offset value, and wherein the agile clock signal has the agile clock frequency equal to the reference frequency plus the base offset frequency, and has an agile clock phase equal to a reference phase plus the offset phase.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method of offsetting a reference frequency of a quadrature reference clock signal, comprising:
   generating the quadrature reference clock signal at the reference frequency, the quadrature reference clock signal comprising first and second sinusoidal signals;

choosing a base offset value from a plurality of possible offset values, the base offset value corresponding to a base offset frequency;

generating a quadrature offset clock signal at the base offset frequency based at least in part on the base offset value, the quadrature offset clock signal comprising third and fourth sinusoidal signals;

performing a polyphase mixing operation between the quadrature reference clock signal and the quadrature offset clock signal to generate an agile clock signal having an agile clock frequency equal to the reference frequency plus the base offset frequency, and determining a phase offset value corresponding to an offset phase, wherein plurality of possible offset values are offset from each other by a set interval corresponding to an offset frequency step, wherein the quadrature offset clock signal is generated at the base offset frequency based at least in part on a frequency offset value, and at the offset phase based at least in part on the phase offset value, and wherein the agile clock signal has the agile clock frequency equal to the reference frequency plus the base offset frequency, and has an agile clock phase equal to a reference phase plus the offset phase.

2. A method of offsetting a reference clock frequency of a reference clock signal, as recited in claim 1, plurality of possible offset values are stored in a local memory, and wherein the step of choosing the base offset value is performed by looking the base offset value up in the local memory.

3. A method of offsetting a reference clock frequency of a reference clock signal, as recited in claim 1, wherein the step of choosing the base offset value is performed by receiving the base offset value from a remote device.

4. A method of offsetting a reference clock frequency of a reference clock signal, as recited in claim 1, wherein each of the plurality of possible offset values is associated with one of a corresponding plurality of remote devices.

5. A method of offsetting a reference clock frequency of a reference clock signal, as recited in claim 1, wherein each of the plurality of possible offset values are associated with one of a plurality of available networks.

6. A method of offsetting a reference clock frequency of a reference clock signal, as recited in claim 1, wherein the base offset value corresponds to a phase increment that will produce the base offset frequency when additively applied to the quadrature offset clock signal at the reference frequency.

7. A method of offsetting a reference clock frequency of a reference clock signal, as recited in claim 1, further determining a revised offset value that reflects an actual frequency offset based on measurements from a received signal.

8. A method of offsetting a reference clock frequency of a reference clock signal, as recited in claim 7, further comprising storing the revised offset value to a memory as one of the possible offset values.

9. A method of offsetting a reference clock frequency of a reference clock signal, as recited in claim 7, further comprising sending the revised offset value to a remote device.

10. A method of offsetting a reference clock frequency of a reference clock signal, as recited in claim 1, further comprising generating a wavelet based on the agile clock frequency.

11. A method of offsetting a reference clock frequency of a reference clock signal, as recited in claim 1, wherein the offset frequency step is between 1 and 20 MHz.

12. A method of offsetting a reference clock frequency of a reference clock signal, as recited in claim 1, wherein the method is implemented in an integrated circuit.

13. A method of offsetting a reference clock frequency of a reference clock signal, as recited in claim 1, wherein the method is implemented in an ultra wideband device.

* * * * *